United States Patent [19]

Asai et al.

[11] 4,287,668
[45] Sep. 8, 1981

[54] METHOD OF INSERTING ELECTRONIC COMPONENTS TO A PRINTED CIRCUIT BOARD

[75] Inventors: Koichi Asai, Nagoya; Tousuke Kawada, Chiryu, both of Japan

[73] Assignee: Fuji Mfg. Co. Ltd., Aichi, Japan

[21] Appl. No.: 86,394

[22] Filed: Oct. 19, 1979

Related U.S. Application Data

[62] Division of Ser. No. 912,392, Jun. 2, 1978, Pat. No. 4,197,638.

[30] Foreign Application Priority Data

Aug. 27, 1977 [JP] Japan .............................. 52/102880
Sep. 10, 1977 [JP] Japan .............................. 52/108982

[51] Int. Cl.³ .............................................. H05K 3/30
[52] U.S. Cl. ................................................... 29/838
[58] Field of Search .................. 29/837, 741, 564.6, 29/838

[56] References Cited

U.S. PATENT DOCUMENTS 4,051,593 10/1977 Mori et al. .................... 29/741 X
4,054,988 10/1977 Masuzima et al. ............ 29/564.6
4,196,513 4/1980 Harigane ........................ 29/837 X

*Primary Examiner*—Nicholas P. Godici
*Assistant Examiner*—C. J. Arbes
*Attorney, Agent, or Firm*—Browdy and Neimark

[57] ABSTRACT

A method of inserting and fixing, by means of a machine, lead wires of the electronic components to a printed circuit board having a number of lead-wire-inserting holes, wherein a movable member relative to the printed circuit board is abutted to an electronic component which is already planted (or inserted) in the neighboring space of the targeted lead-wire-inserting holes for the component-to-be-planted, in order to slightly push away the already planted component for clearing or expanding the neighboring space, by means of causing a deformation to the lead wires of the already planted component. This invention includes the provision of apparatuses for realizing the above-mentioned method into practical use.

7 Claims, 23 Drawing Figures

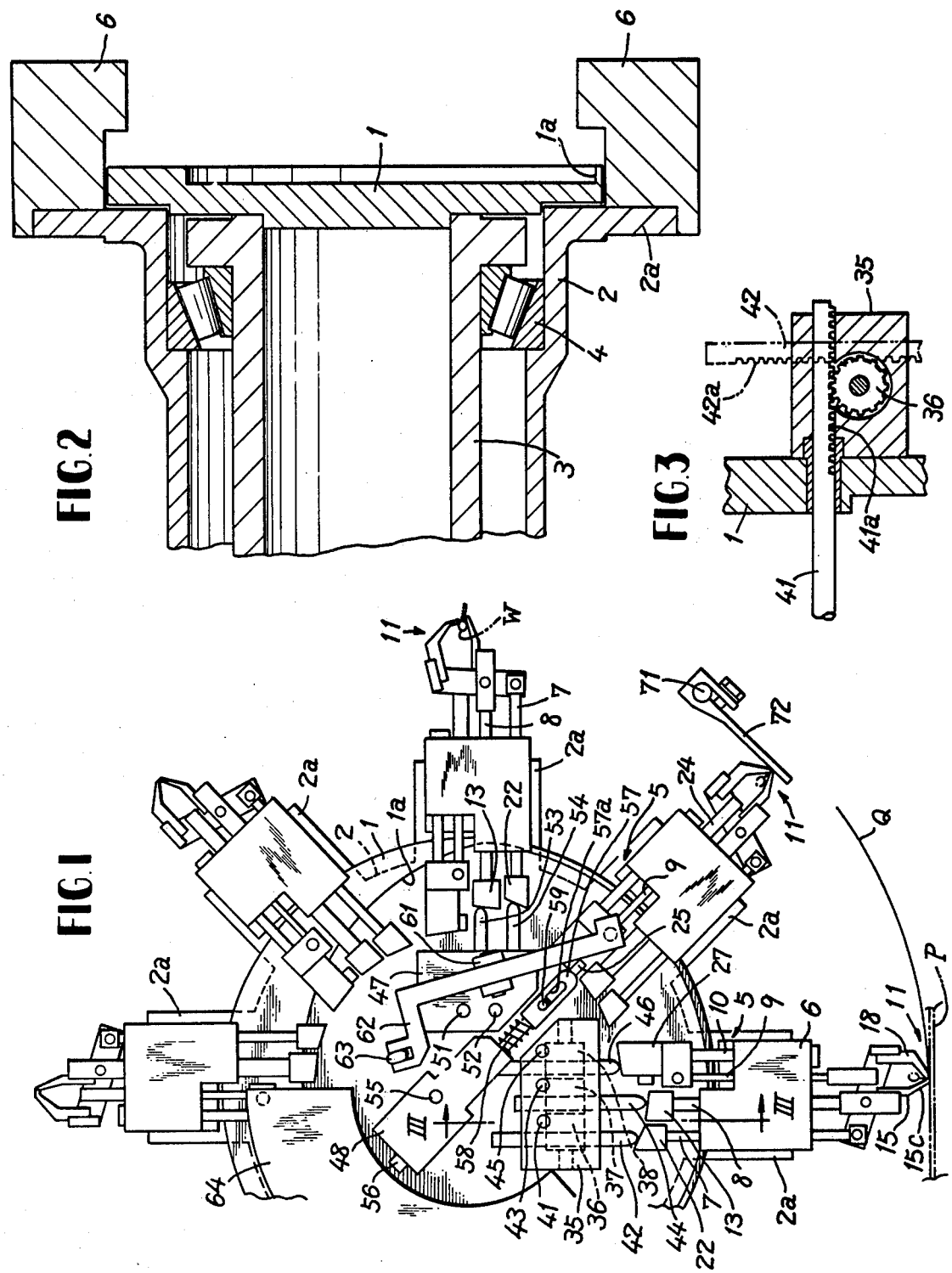

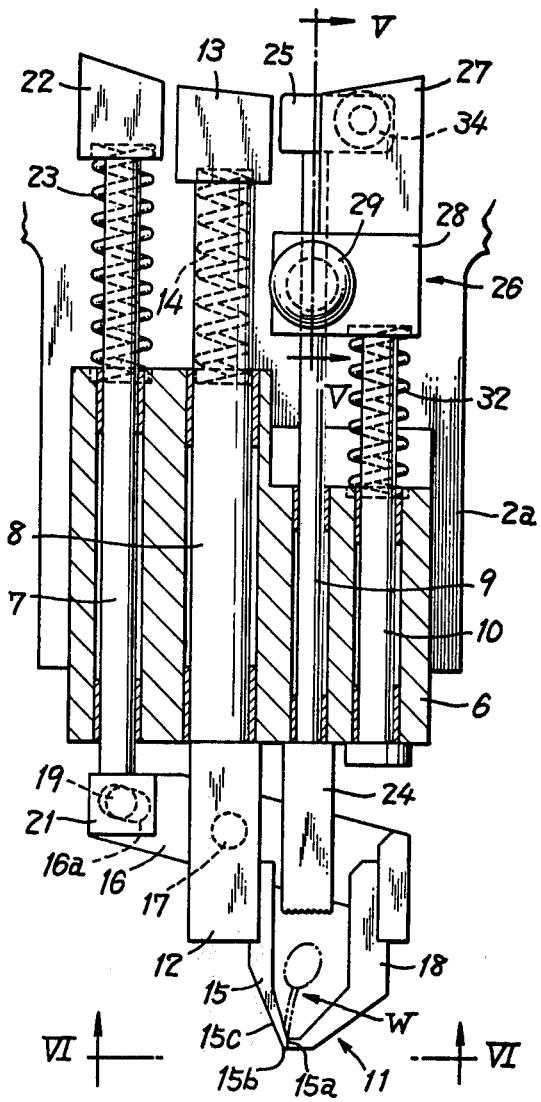
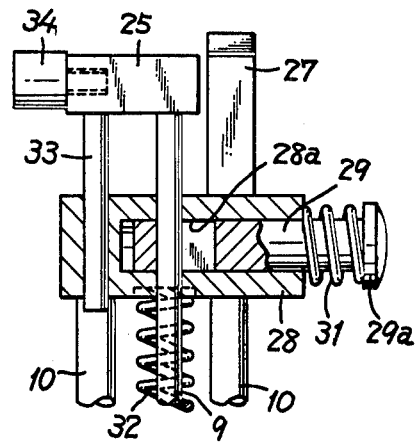
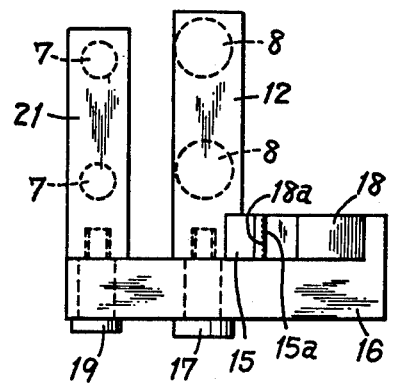
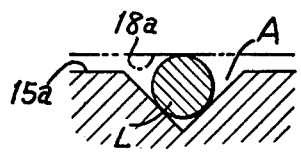
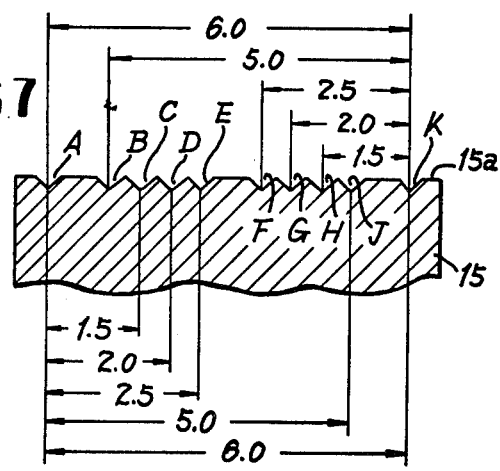

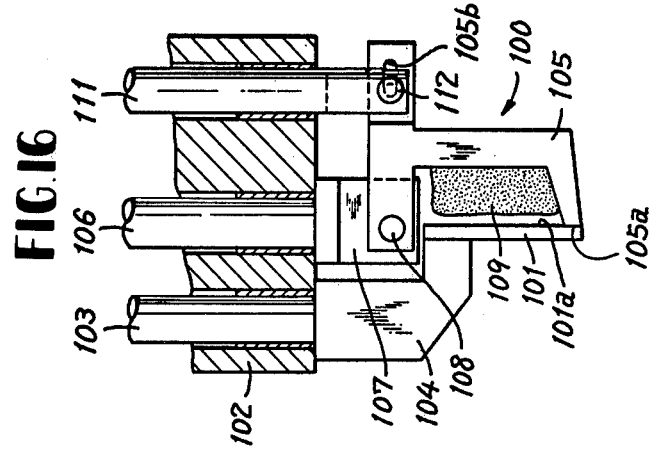

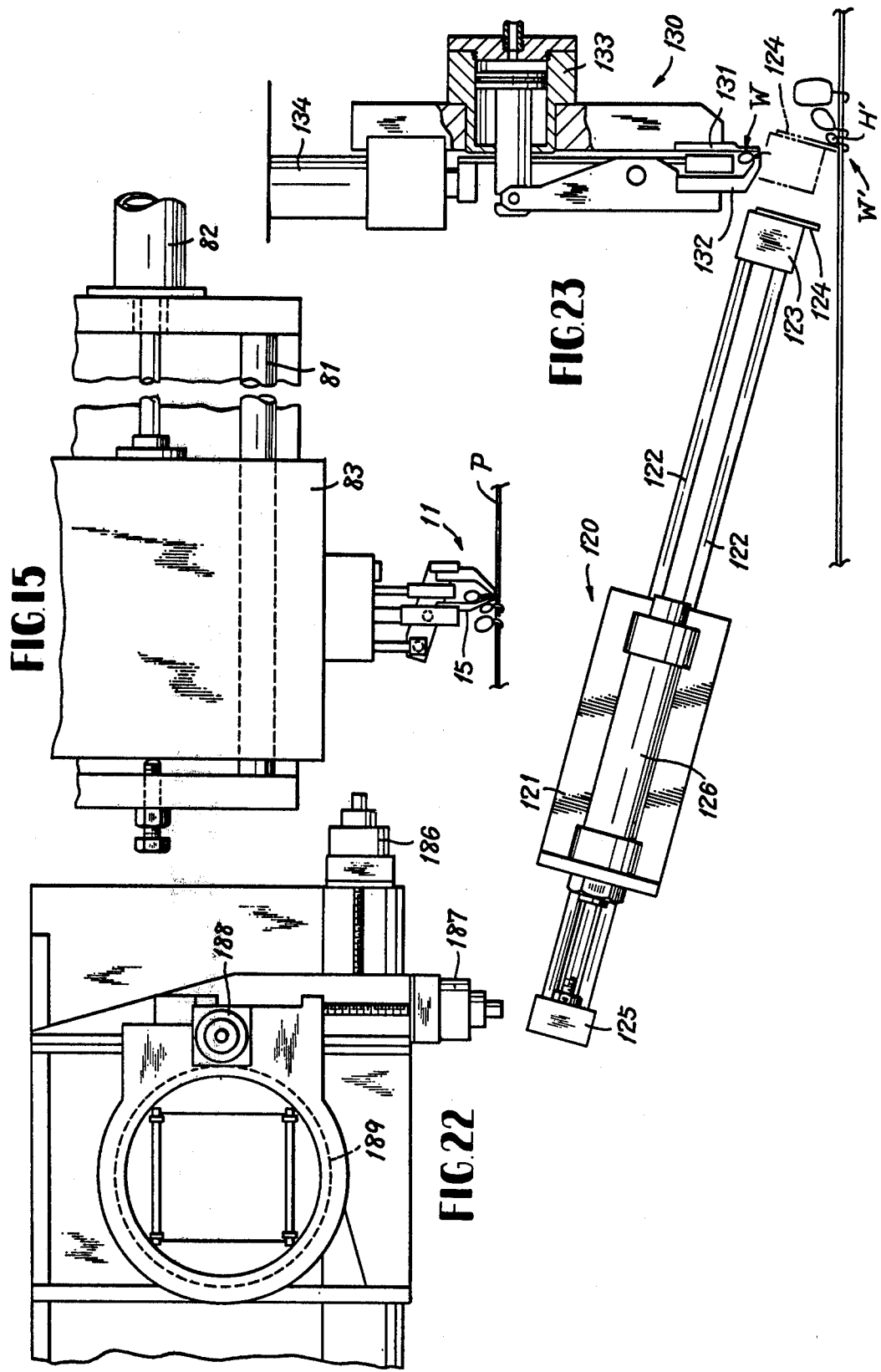

METHOD OF INSERTING ELECTRONIC COMPONENTS TO A PRINTED CIRCUIT BOARD

This is a division, of application Ser. No. 912,392 filed June 2, 1978, which has matured as U.S. Pat. No. 4,197,638.

BACKGROUND OF THE INVENTION

The present invention relates to a novel method of automatic inserting and fixing of electronic components or parts, with a machine, into holes in a printed circuit board as well as apparatuses suitably employable for the practice of the method.

Some kinds of method and apparatuses are known, which have been remarkably contributing to the rationalization of the assemblying work in the fields of television sets, audio appliances, various controlling means, etc. Basic principle of these conventional inserting apparatuses lies in employing of an insertion guide having guide holes or grooves, moving of the electronic components (hereinafter called simply component) to be planted with some separate means, such as chucks and pushers, toward the guide holes or grooves, and bringing of the lead wires of the components to the lead wire inserting holes in a printed circuit board (hereinafter called p-c-b). This insertion guide generally approaches to the p-c-b from a direction perpendicular to the surface of the p-c-b which is already positioned at a preset position; if the tip of the insertion guide, when being approached to the p-c-b, interferes with an already inserted electronic component, it might force down and squeeze the component between itself and the p-c-b. The component is therefore necessitated to be located on the p-c-b with an ample space from other components in order to avoid the interference. It naturally causes the distribution density of the components on the p-c-b far lower than that in case of manual insertion.

The low distribution density of the components will, in turn, lead to enlarging of the area of the p-c-b for inserting a certain number of components, which results in an enlargement in size of apparatuses or machines incorporating the p-c-b as a structural member. Development of a machine capable of inserting electronic components at a high distribution density has been strongly desired from many industrial fields. This invention has been made from such a background.

SUMMARY OF THE PRESENT INVENTION

A principal object of this invention is therefore, in case of inserting electronic components to a p-c-b with a machine, to provide a method which enhances the distribution density of inserted or planted components for the area of the p-c-b.

Another object of this invention is, for attaining the above-mentioned first object, to push away the already planted components in the vicinity of the targeted inserting holes in the p-c-b, by means of imparting an elastic or plastic deformation to the lead wires of the already planted components, from the neighboring space of the targeted holes, and thereby enabling the insertion of the lead wires of the components-to-be-planted into the targeted inserting holes.

A still another object of this invention is to enable the pushing away of the already planted components in the vicinity of the targeted inserting holes to be executed as reasonably as possible.

A still further object of this invention is to provide a novel method of inserting various kinds of components having a variety of inter-lead-wire distance, with high efficiency as well as high distribution density in the p-c-b.

It is of course a basic object of this invention to provide a novel method of inserting (or planting) electronic components to a p-c-b with high efficiency, on which the inserting machine theoretically depends.

BRIEF DESCRIPTION OF THE DRAWINGS

FIG. 1 is an elevation of an essential part of an embodiment which can be used in carrying out the method in accordance with this invention;

FIG. 2 is a side view, in section, for showing the structural inter-relation between a cam plate and an index table in FIG. 1;

FIG. 3 is a cross-sectional view taken along the line III—III of FIG. 1;

FIG. 4 is an enlarged elevation, partly in section, of a chucking mechanism in FIG. 1;

FIG. 5 is a cross-sectional view taken along the line V—V of FIG. 4;

FIG. 6 is a projective view taken along the line VI—VI of FIG. 4;

FIG. 7 is an enlarged transverse cross-sectional view of guide grooves formed on a fixed pawl of chucking mechanism shown in FIG. 4;

FIG. 8 is an enlarged explanatory view of a guide groove, shown in FIG. 7, in which a lead wire of an electronic component is being guided;

FIGS. 9–14 are explanatory views for the inserting process of electronic components by means of the apparatus shown in FIG. 1;

FIG. 15 is an elevation of another embodiment which can be used in carrying out the method in which the chucking mechanism is horizontally slidable;

FIG. 16 is a view corresponding to FIG. 4 for showing still another embodiment;

FIGS. 17–21 are all views for explaining the inserting operation by means of an apparatus shwon in FIG. 16;

FIG. 22 is a plan view of a positioning means for the p-c-b used in still another embodiment which can be used in carrying out the method; and FIG. 23 is an elevation of an essential part of still further embodiment (partly broken away).

DETAILED DESCRIPTION OF THE PREFERRED EMBODIMENTS

With reference to the appended drawings, preferred embodiments will be described in detail hereunder.

CONSTRUCTION

In FIG. 1, an elevational view of an essential part of an inserting apparatus of this invention, 1 denotes a cam plate, and 2 denotes an index table, which cam plate 1 is secured to a supporting cylindrical member 3, a part of the principal body of this apparatus, and is provided with an inner peripheral cam surface 1a for drawing back a pusher (later described). The index table 2 is being carried, via bearings 4, by the supporting member 3, for intermittently rotated one eighth ($\frac{1}{8}$) round each time by a conventional rotating mechanism (dividing or indexing mechanism, not shown). This index table 2 is provided with eight projections 2a, protruded in the radial direction with an equal circumferential angular distance to each other. On each projection 2a is disposed a chuck supporting means 5, being eight in all, which is respectively provided with a guide block 6 secured on the projection 2a and a plurality of rods 7, 8, 9, 10 passed axially and slidably through the guide block 6. On the tip portion of these rods, 7-10, is attached a chucking mechanism 11 which is open and closable in a normal direction to a plane including a pair of lead wires of a component-to-be-planted. The chucking mechanism 11 will be further in detail described referring to FIGS. 4-8. As can be seen in FIG. 6, a pair of rods are disposed, both being connected at the tip thereof (lowest end in FIG. 4) by a block 12 and at the end portion thereof by a connecting block 13. Between the guide block 6 and the connecting block 13 is disposed a compression spring 14 for biasing the rods 8, via the connecting block 13, toward the end portion (upward in FIG. 4).

On the block 12 is secured a fixed pawl 15, a portion of the chucking mechanism 11, which is preferably as thin and straight in configuration as possible and the bent angle on the tip portion 15c is made about 20° in this embodiment. On the chucking portion 15a thereof for holding the lead wires, confronted with a movable pawl 18, a cooperating counterpart for chucking, are formed guide grooves A, B, C, D, E, F, G, H, J, and K, as shown in enlargement in FIG. 7, which grooves are all formed perpendicularly to the surface of the tip portion 15b. These grooves, while chucking lead wires (hereafter alloted a mark L when needed) in pair, can be used by twos as a pair, from two directions, one way being such as A and C, A and D, A and E, A and J, and A and K from the left side, and the other way being such as K and H, K and G, K and F, K and B, and K and A from the right side, with the respective distance 1.5, 2.0, 2.5, 5.0, and 6.0 mm, as shown in FIG. 7. This arrangement is aimed at free selective use of the chucking position, for example, rightwardly biased portion or leftwardly biased portion according to the situation of the p-c-b, i.e., the distribution status of the already inserted electronic components (hereafter alloted as mark W' when needed) and that of the holes hence to be inserted. On the block 12, on which the fixed pawl 15 is secured, is pivoted a lever 16 with a pin 17; on one end of the lever 16 is secured a movable pawl 18 of the chucking mechanism 11. With a cooperative movement of the movable pawl 18, which is rotated by the rotation of the lever 16 about the pin 17, the chucking mechanism 11 can be opened and closed for holding lead wires L. The lead wires L are to be held or retained between the grooves, A to K, formed on the fixed pawl 15 and the movable pawl 18. The other end of the lever 16 (opposite from one end where the movable pawl is fixed) is connected to the end of a rod 7 with a pin 19, which pin 19 is passed through an elongated hole 16a formed in the lever 16 to be secured to a block 21. The rod 7 are also disposed in a pair, similarly to the rods 8, both being connected at one end (lower portion) by the block 21 and at the other end (upper portion in FIG. 4) by a connecting block 22. Between the connecting block 22 and the guide block 6 is disposed a compression spring 23 for biasing, via the connecting block 22, the rods 7 toward the other end portion (upper).

Between the fixed pawl 15 and the movable pawl 18 of the chucking mechanism 11 is disposed a pusher head 24 (seen in FIG. 4), which is secured to the tip of the rod 9 and downwardly movable by applying a pressure on the connecting block 25 fixed to the end portion of the rod 9. The rod 9 is also connected, via a clutch 26, to another connecting block 27. The clutch 26 is composed, as shown in FIG. 5, of a clutch housing 28 secured to an end portion of a pair of rods 10 which are guided by the guide block 6, a piston 29 slidably fitted in a bore 28a formed in the clutch housing 28, a head 29a of the piston 29, and a compression spring 31 disposed between the head 29a and the housing 28. The clutch 26 functions to connect and disconnect the rod 9 and the connecting block 27, through a frictional force produced between the housing 28, the piston 29 and the rod 9 which passes through those members, due to the elasticity of the compression spring 31. Between the clutch housing 28 and the guide block 6 is disposed a compression spring 32 for biasing the clutch 26 upwards (refer to FIG. 4). A guide rod 33 securely connected to the connecting block 25 and slidably passing through the clutch housing 28 restricts the rotation of the connecting block 25, the rod 9, and the pusher head 24. And on the connecting block 25 is pivotally attached a cam follower 34.

Now the operation mechanism to work the clutch supporting means 5 and the chucking mechanism 11 will be described.

On the cam plate 1 is secured, as FIG. 1 shows, a pinion housing 35, in which three pinions 36, 37, and 38 are mounted, respectively rotatable independent of each other. On the cogs of the pinion 36 are engaged, as shown in FIG. 3, respective rack portions 41a and 42a of push rods 41 and 42; when the push rod 41 is rightwardly moved by a not-shown cam which is rotatably interlocked with a rotation mechanism of the index table 2, the push rod 42 is downwardly moved by the same distance as that of the former 41. As to the other pinions 37 and 38 the functional situation is entirely identical, i.e., the push rods 43, 44 and those 45, 46 are respectively movable by the same distance in a 90° differently phased direction. In other words, the object of mounting the pinion housing 35 lies in changing the direction, by 90°, of the movement of the push rods 41, 43, and 45 (disposed in the supporting member 3 parallelly to the axis thereof) which is respectively imparted by a cam member (not shown, but located to the left of the supporting member 3 in FIG. 2), for delivering respectively the direction-changed movement to the push rods 42, 44, and 46. These three push rods 42, 44, and 46 respectively abuts on the connecting blocks 22, 13, 27 for urging them.

On the cam plate 1 are secured other pinion housings 47 and 48 of the same construction as the pinion housing 35. The movement of push rods 51 and 52 is delivered to push rods 53 and 54 respectively. The movement of the push rod 55 is delivered to the push rod 56. The push rods 53 and 54 respectively abuts on the connecting block 22 and 13 to urge them. On the tip of the push rod 56 is slidably mounted a pusher 57 of bottomed cylindrical form; it is constantly biased, by a compression spring 58, to the pushing direction. The urging or protruding is, however, restricted within a certain limit by an engagement between a pin 59 and an elongated bore 57a through which the pin 59 passes, force of which urging being delivered, via the compression spring 58 and the pusher 57 onto the connecting block 25.

On the pinion housing 47 is secured a bracket 61, on which being, in turn, pivoted a clutch releasing lever 62 at a central portion thereof. One end of the lever 62 is confronted to the head 29a of the piston 29 (of the clutch 26), the other end thereof being pivoted to a push rod 63.

On the cam plate 1 is attached a clutch releasing plate 64 of sector shape at a location being interfered with the piston head 29a; when the piston 29 rotates according to the rotation of the index table 2, it is to be contacted with the clutch releasing plate 64 for releasing the clutch 26. The inner peripheral cam surface 1a of the cam plate 1 is in contact with the cam follower 34, which is pivoted on the connecting block 25, and is so configurated as to move or draw back the cam follower 34, the connecting block 25, the rod 9, and the pusher head 24 toward the axial line of the index table 2.

OPERATION

The index table 2, which is on the outer periphery thereof provided with eight sets of chucks (including chuck supporting means 5 and chucking mechanism 11) with an equal circumferential angular distance to each other, is intermittently rotated in clockwise direction, that is, the direction in which the chucking mechanism moves toward the fixed pawl 15 (in FIG. 1). Along with the operation of the index table 2, a synthetic or entire operation system (including a not-shown cam, push rods 41–46, 51–56, pinions 36–38, pusher 59, cam releasing lever, etc.), which is interlocked with the index table rotating mechanism, called indexing mechanism, is worked to operate, via the chuck supporting means 5, the chucking mechanism 11. Look at first of all the chuck, in FIG. 1, located to the right of the index table 2, wherein the rods 8 and 7 are advanced by the push rods 53 and 54 to make the chucking mechanism 11 approach to an electronic component W retained by a work or component supplying means (not shown), when the rod 7 is advanced more than the rod 8 so as to open the chucking mechanism 11 while nearing the component W. When the component W has been held between the fixed pawl 15 and the movable pawl 18, the push rod 54 is drawn back accompanied by withdrawing of the rod 7, due to the elasticity of the compression spring 23. Lead wires L of the component W are retained from a normal direction to a plane including the lead wires by the just closed chucking mechanism 11, as shown in FIG. 9.

It is of course very important to position the work supplying means accurately, so as to make the position of the lead wires L of the component W to be picked up completely agree with the position of the pair of grooves to be selected, among A to K, on the fixed pawl 15. In this embodiment, the arrangement of the grooves is conveniently made avairable from either side, as earlier mentioned. The chucking mechanism 11 is so designed as to be able to select in accordance with the circumstances on the p-c-b, either side of the groove pairs at the base for chucking; the positioning of the work supplying means must of course be executed fully taking this arrangement of the groove pairs into consideration.

If and when the lead wires L of the component W are cut, at a preset length, and the wire distance or gage (between the two) is already agreed with the predetermined standard, there would be no problem in making the retaining or holding of the component W, by the chucking mechanism 11 at the lead wire portion L, just like that in FIG. 9. In case of taping (components W are planted at their lead wires with a certain distance on a coiled tape), as usually the case is, it is required to clip the wires, upon their having been held by the chucking mechanism 11, to a certain preset length.

When the chucking mechanism 11 has firmly retained the lead wires L of component W, the push rod 53 is drawn back to allow the rod 8 to be retracted due to the elasticity of the compression spring 14, which causes the withdrawing of the chucking mechanism 11, with the lead wires L of the component W held therein.

While the chuck located to the right of the index table 2 is working as described above, another chuck located just right-under thereof, i.e., one positioned 45° lower than the former, is operated as undermentioned. A lever 72 secured to a shaft 71, which is rotated by a not-shown actuating means, is rotated to push back the lead wires L of component W held by the chucking mechanism 11 such that the projected portion of the lead wires L from the tip of the chucking mechanism 11 comes back to the tip level of the chucking mechanism 11, like illustrated in FIG. 10. The clutch releasing lever 62 is then, by the push rod 63, rotated to push back the piston 29 of the clutch 26 inside the clutch housing 28, resisting the elasticity of the compression spring 31, which results in the release of the clutch 26. The push rods 55, 56 are actuated at this time, for pressing the connecting block 25, via the compression spring 58 and the pusher 57, to advance the same, the rod 9, and the pusher head 24 in order, and finally to make the last one abut on the head H (when specifically referred to the head portion it will be marked H) of the component W, as shown in FIG. 11. As a result of this, a reaction force acting from the connecting block 25 toward the pusher 57 will be rapidly increased to surpass the set load of the compression spring 58. In spite of the starting of contraction of the spring 58, which is initiated by the above reaction force, the pusher 57, the connecting block 25, the rod 9, and the pusher head 24 will not advance, even when the push rod 56 is advanced. Restoration of the clutch releasing lever 62, at this time, to the original position will connect or actuate the clutch 26 to keep the pusher head 24, at its abutted position on the component head H, being fixed to the connecting block 27.

The operation of the chuck at the lowest portion of the index table 2 (FIG. 1) must be lastly explained. The chucking mechanism 11 on this chuck is advanced forward while the index table 2 is rotated clockwise. As soon as the index table 2 begins to rotate, the push rod 43 begins to move for advancing the rod 8; it means the chucking mechanism 11 is rotated together with the index table 2 while it radially advances to approach to the p-c-b, which is positioned at a desired location by a not-shown positioning means. The p-c-b P is to be positioned in a tangential direction against a circle Q, which is centered at the index table's center, and the chucking mechanism 11 is so operated as to reach its most advanced posture immediately before the index table 2 comes to a halt. So the chucking mechanism 11 moves substantially in parallel with the p-c-b P when it nears the targeted position on the p-c-b P. As the chucking mechanism 11, moving in the arrow (R) marked direction in FIG. 12, approaches the targeted hole, with the fixed pawl 15 ahead, it pushes away the head H' of an already planted component W', at a closely neighbored position to the targeted hole as shown with a two-dot-chain line, with the back or outside 15d of the fixed pawl 15 as far as reaching the condition shown with a solid line, in order to clear the surrounding space of the targeted holes. The already planted component W' can be consequently moved toward another component W" which had been planted further prior, the distance S between the two components W' and W" being decreased. This distance S was determined by the very thickness of the fixed pawl 15 when W' was planted due to its occupation between W' and W", which thickness being designed as thin as possible and being far thinner than conventional ones. This invention has further reduced that reduced distance of W' and W" to the greatest extent, making both heads H' and H" almost contact to each other. It means the distribution pitch U, in FIG. 12, on the p-c-b P between the components W has been remarkably reduced in comparison with the prior art; insertion of components W, W' and W" in a high distribution density has been achieved by this invention.

When the chucking mechanism 11 has been halted at an exactly targeted position on the p-c-b P, the push rods 45, 46 are actuated to advance the pusher head 24, by the distance of the advanced length of the chucking mechanism 11 plus the length by which the lead wires L should be protruded from the chucking mechanism 11. The component W is, as shown in FIG. 13, moved downwardly to render the lead wires L protrude from the chuking mechanism 11, for being inserted into the inserting holes Pa in the p-c-b P. After the protruded portion of the lead wires L below the lower side Pb of the p-c-b P has been bent or clinched by a not-shown clinching means, the push rods 41, 42, are actuated to advance the rod 7, resulting in opening of the chucking mechanism 11 by the rotation of the movable pawl 18 as shown in FIG. 14. Then the push rods 41, 42, 43, 44, 45, and 46 are retracted, followed by the withdrawing of the chucking mechanism 11 and the pusher head 24 in the radial direction of the index table 2. As the index table 2 is, being in interlocking relation with this retracting movement, further rotated clockwise together therewith, in FIG. 1, the actual retracting direction of the chucking mechanism 11 is not exactly perpendicular to the p-c-b P surface, rather substantially parallel to the direction of the bent portion 15c of the fixed pawl 15. The push rods 41, 42 are retracted by a longer distance than the push rods 43, 44 are retracted, causing the chucking mechanism 11 to be closed while being drawn back. After the chucking mechanism 11 has worked at the above-mentioned three positions, right side, 45° lower of the right side, and bottom side of the index table 2, it will be further rotated ⅛ round (45°) together with the index table 2 clockwise to finish one cycle of the inserting operation of the component W.

The work supplying means supplies, at a preset order, various electronic components W of different lead-wire-distance (or gage), and the positioning means fixes the position of the p-c-b P to be worked. Such a well arranged combination of the two means makes possible to plant various components W, in spite of the difference of the lead wire gage, on a p-c-b in good order from one side thereof.

Arrangement of plurality of chucking mechanisms 11, as in this embodiment, around the index table 2, allows to divide a series of operation into a several work stages (3 in this embodiment) to be executed parallelly in high efficiency. The merit lies in a remarkable reduction of the time required for inserting.

This invention, however, is not being limited to this embodiment. Some variations and modifications are also possible, a few examples thereof being outlined hereunder.

The chuck may, instead of being mounted on an index table, be mounted on a movable body 83, in FIG. 15, horizontally slidable on a pair of guide rails 81 parallel to the p-c-b P, by means of an air cylinder 82. And the chucking mechanism 11, in this case, may be approached, in parallel with the surface of the p-c-b P, with the fixed pawl 15 being ahead, to the targeted holes for attaining the object of this invention.

In the above-mentioned first embodiment, the lead wires L retained by the chucking mechanism 11 are once pushed inside the mechanism 11, by means of the lever 72, and again pushed outside the mechanism 11, when they have reached right above the targeted holes, to be inserted to the inserting holes Pa in p-c-b P. The tip of the lead wires L can not therefore be damaged when they are parallelly moved to the p-c-b P surface, by touching any obstacles. Similar advantage can be attained by another method, e.g., wherein the chucking mechanism 11 is parallelly moved relative to p-c-b P, with the protruded lead wires L being of the shortest allowable length and not being in touch with p-c-b P, and the fixed pawl 15 may be stopped right above the targeted holes keeping the required distance from the surface of the p-c-b as necessary W' so that the back 15d of the fixed pawl 15 may push away the head H' of the already planted component W'. Then the lead wires L are to be inserted into the targeted holes by moving the chucking mechanism 11 perpendicularly to the p-c-b P. In this case the chucking mechanism 11 is not necessarily required to have the guide grooves, A to K, for retaining the lead wires L; either or all of the retaining surface of the mechanism 11, 15a and 18a, may be advantageously lined with rubber for preventing slippage of the retaining position of the lead wires L. The chucking mechanism 11 may, not limited to the above mechanical operation, be actuated by other means in its opening and closing operation, such as, magnetism, air under pressure, etc.

Furthermore, the configuration of the chucking mechanism 11 is not limited to the above-mentioned, but it may be one illustrated as 100, for example, in FIG. 16. In the figure, 101 denotes a fixed pawl, which is fastened by any well-known means, such as threading, to a block 104 secured to the tip of a pair of rods 103, which are axially slidable through the guide of a guide block 102. The movable pawl 105, different from that 18 in the chucking mechanism 11 in FIG. 1, is pivoted by a pin 108 to a block 107, which is secured to the tip of a pair of rods 106 shiftable unrelatedly with the rod 103. This movable pawl 105 is provided with a pad 109 of foamed urethane sticked to the inside wall thereof, and with guide grooves on the retaining surface 105a just like those in FIG. 7. This movable pawl 105 can be rotated about a pin 108 by a rod 111 axially slidable through the guide of the guide block 102. A hole for containing a pin 112 pivotably connecting the rod 111 and the movable pawl 105 is elongated in configuration. The rods 103, 106, and 111 are shifted at a preset time by an operating mechanism, not shown but including cam means. As the chucking mechanism 100 in this embodiment is constructed like this, the component W held by the fixed pawl 101 and the movable pawl 105 at its lead wire portion L can be, as shown in FIGS. 17 and 18, withdrawn until the lead wires come within the tip level of the fixed pawl 101 as shown in FIG. 19, by means of drawing back the movable pawl 105 in relation to the fixed pawl 101. In this stage, the pad 109 serves to hold the component head H for moving upward together with the movable pawl 105. When the chucking mechanism 100 is moved to a targeted place (holes) in the p-c-b P, the lead wires L are just protected by the fixed pawl 101, and there is no fear of their being damaged by touching any obstacle(s).

As the chucking mechanism 100 has been rightly positioned, the movable pawl 105 is advanced relative to the fixed pawl 101 to insert the lead wires L into lead wire inserting holes Pa in the p-c-b P, as shown in FIG. 20. The distance or gage of the two lead wires L is regulated by the distance between the grooves formed on the surface of the movable pawl 105, and the lead wires L are also regulated in the perpendicular direction to the retaining surface of the fixed pawl 101, as they are closely contacted thereto. An accurate inserting of the lead wires L into the holes Pa in the p-c-b P is thus ensured. In this embodiment, a little bending of a part of the lead wires L as shown in FIG. 18 is thought to be highly effective in rendering the lead wires L closely contact to the inner surface 101a of the fixed pawl 101. When the projected part of the lead wires L to the back side of the p-c-b P are bent or clinched as shown in FIG. 21 by a clinching means (not shown), the movable pawl 105 is rotated about the pin 108 to leave the just planted component W there, for returning the chucking mechanism 100 to the original condition shown in FIG. 15. This is the end of a cycle of inserting an electronic component W.

In this embodiment, as can be clearly observed in the above description, the movable pawl 105 further plays the role played by the lever 72 and the pusher head 24 in the embodiment of FIG. 1. It greatly serves to simplify the structure of the apparatus, consequently reduce the production cost. Furthermore, the foamed urethane contained in the movable pawl 105 may be eliminated, if only the coefficient of friction between the fixed pawl 101 and the lead wires L could be made smaller than that between the movable pawl 105 and the lead wires L. Because the lead wires L will be moved together, in this instance, with the movable pawl 105, sliding over the inner surface of the fixed pawl 101. In order to differentiate the coefficient of friction between the two places, several measures are practicable (1) employment of different material for the fixed and movable pawls; (2) differentiate the surface coarseness of the pawls; (3) attaching or coating some material of large coefficient of friction (e.g. rubber) or of small coefficient of friction (e.g. tetrafluoroethylene) on either party of both; and (4) forming of V-shaped grooves, as in FIG. 7, on the inner surface of the fixed pawl 101 and of finely arranged parallel ribs on the retaining surface of the movable pawl 105 in the perpendicular direction to the moving direction of the same. All has to be done is, in short, to make the both pawls 101, 105 different in the coefficient of friction, by means of rendering at least either one large or small, for ensuring the lead wires L to be brought upward or downward together with the movable pawl 105 when the both pawls are moved relatively to each other.

Incidentally, the chucking mechanism 11 described above is, not only advantageously employed in this invention but also practicable broadly in any other electronic component inserting operation.

As for a position regulating means for rendering the relative position between the lead wire tips and the targeted lead wire inserting holes perfectly agree or conform, such a chucking mechanism mentioned in the above, composed of a fixed pawl and a movable pawl, which is open and -closable (either by rotating movement or sliding movement), which holds a component W from a perpendicular direction relative to a plane including a pair of lead wires is most preferable. It is, however, not necessarily limited to this concept; for example, a chucking mechanism in which all of the pawls are movable for opening or closing is allowable. As to the direction of retaining the lead wires L is not limited to the type above-mentioned, i.e., to retain a component W from a perpendicular direction to the plane including both lead wires L. A chucking mechanism in which pawls retain a component W in a parallel direction to the plane including the both lead wires L is also allowable. Approaching to the targeted holes by means of parallel moving of conventionally used inserting guides to the surface of the p-c-b P, does not contradict to this invention. As for the means to push away the head H' of an already planted component W', this invention does not necessarily stick to the position regulating means in a narrow sense, but it allows to include some other members attached thereto, in addition to the narrow sensed position regulating means, for achieving the object. For nearing the position regulating means to the targeted lead wire inserting holes from a direction parallel to the surface of the p-c-b P, moving of the same is not the only way thereto, but the moving of the p-c-b P in a parallel direction to the surface thereof, after the position regulating means once has been approached to the surface of the p-c-b, is also practicable. As the p-c-b, as shown in FIG. 22, is usually attached on a movable body 189, which is freely movable in all direction horizontally within a plane (and also rotary movement) by a positioning means having a servomotor 186, 187, 188, in FIG. 22, for being positioned at a desired position, even the pushing away of the head H of the component W can be carried out, by taking advantage of this horizontal movement of the p-c-b for positioning.

In the above-mentioned embodiments, the position regulating means for exactly conform the lead wires L of the component W to the inserting holes in the p-c-b P concurrently functions as a remover to push away the head H' of the already planted component W' from the immediately neighboring space of the targeted holes. It is also possible to employ a specific remover 120, as in FIG. 23, for the purpose of pushing away the head H' of the already planted component W'. The remover 120 is constructed such that a pushing plate 124 is, via a block 123, connected to one end (right side end in FIG. 23) of a pair of rods 122 which are being guided by a guide block 121, on which an air cylinder 126 is secured. On the other end of the rods 122 is a block 125 which is connected with the air cylinder 126. Due to the retracting stroke of a piston rod in the air cylinder 126, the pushing plate 124 is advanced as far as the position indicated by a two-dot-chain line in FIG. 23 to push away the head H' of an already planted component W'. After the pushing plate 124 has been retracted, the chucking mechanism 130 is lowered to carry out the inserting of the component W. The chucking mechanism 130, shown in FIG. 23, is an example which is driven by an air cylinder. For the opening and closing of the movable pawl 132 against the fixed pawl 131 an air cylinder 133 is disposed and for the lowering and lifting of the chucking mechanism 130 another air cylinder (not shown) is disposed through a rod 134.

What is claimed is:

1. A method of inserting by means of a machine lead wires of electronic components into lead wire inserting holes, formed in a large number over a printed circuit board, and fixing them thereto, said method comprising at least one cycle of under-mentioned inserting operations:

a step of expanding the environmental area of targeted holes by pushing away the head portion of an already inserted component or components positioned within the closely neighboring space of said targeted holes, by means of abutting a member movable relatively to said printed circuit board onto said head portion and deforming the lead wires of said already inserted component; and a step of inserting the lead wires of a component-to-be-inserted into said targeted holes to be fixed there by clinching, whereby the inserting of the lead wires of said components at a high distribution density can be achieved.

2. A method claimed in claim 1, wherein the step of expanding the environmental area of targeted holes is effected by employing a specific remover for pushing away the head portion of said already inserted component or components, and the step of inserting the lead wires of said component to be inserted into said targeted holes is carried out by employing an inserting means separately operated from said remover.

3. A method of inserting by means of a machine lead wires of electronic components into lead wire inserting holes, formed in a large number over a printed circuit board, and fixing them thereto, said method comprising at least one cycle of under-mentioned inserting operations:

a step of holding a component, which is fixed on a tape at the tip of the lead wires, at the intermediate portion thereof, with a chucking mechanism including a fixed pawl and a movable pawl, which is capable of opening and closing against said fixed pawl, from a normal direction to a plane including said lead wires.

a step of separating said component held by said chucking mechanism from said tape by means of cutting said lead wires at a portion between said chucking mechanism and said tape;

a step of pushing back the projected portion of said held-lead-wire from the chucking mechanism thereinto, until no portion being left projected;

a step of moving said chucking mechanism holding said component toward targeted holes out of said lead wire inserting means, with said fixed pawl ahead, in a substantially parallel direction, at least in the neighborhood of said targeted holes, to the surface of said printed circuit broad, and pushing away with the outside of said fixed pawl the head portion of an already inserted component or components from the neighboring space of said targeted lead wire inserting holes ;

a step of inserting the lead wires of said component into said targeted holes and clinching the same after said chucking mechanism has reached right above said targeted holes; and a step of retracting said chucking mechanism, taking an appropriate direction avoiding the interference with the component which has just been inserted, from said printed circuit board, after said inserting and clinching process has been finished.

4. A method of inserting lead wires of electronic components into lead wire inserting holes formed in a large number over a printed circuit board having a surface and fixing thereto by means of a machine having a position of the tip portion of the lead wires of a component-to-be inserted to exactly agree with that of targeted holes out of said lead wire inserting holes, said method comprising:

a moving step of relatively moving said printed circuit board and a position regulating means in a substantially parallel direction to the surface of said printed circuit board;

a step of pushing away the head portion of an already inserted component or components located within closely neighboring space of said targeted holes from said space by said position regulating means during last period of said moving step;

a step of stopping the relative movement of said printed circuit board and said position regulating means when said position regulating means has arrived above said targeted holes;

a step of inserting the lead wires of said component-to-be-inserted, while tip portion thereof is regulated by said position regulating means, into said targeted holes;

a step of clinching the lead wires inserted into said targeted holes; and a step of retracting said position regulating means, taking an appropriate direction for avoiding interference with the component which has just been inserted, from said printed circuit board.

5. A method claimed in claim 4 wherein said position regulating means is a chucking mechanism including a fixed pawl and a movable pawl, which is capable of opening and closing against said fixed pawl, and said chucking mechanism holds said lead wires of said component-to-be-inserted from a normal direction to a plane including said lead wires, approaches to said targeted holes, with said fixed pawl ahead while rotating about a straight line parallel to said printed circuit board, and pushes away the head portion of said already inserted component or components with the outside of said fixed pawl from the neighboring space of said targeted lead wire inserting holes.

6. A method claimed in claim 4, wherein said position regulating means is a chucking mechanism including a fixed pawl and a movable pawl, which is capable of opening and closing against said fixed pawl, and said chucking mechanism holds said lead wires of said component-to-be inserted from a normal direction to a plane including said lead wires, approaches to said targeted holes, with said fixed pawl ahead, while moving along a straight line parallel to said printed circuit board, and pushes away the head portion of said already inserted component or components with the outside of said fixed pawl from the neighboring space of said targeted lead wire inserting holes.

7. A method claimed in claim 4, wherein said position regulating means is a chucking mechanism including a fixed pawl and a movable pawl, which is capable of opening and closing against said fixed pawl, and said chucking mechanism holds said lead wires of said component-to-be-inserted from a normal direction to a plane including said lead wires, approaches to the surface of said printed circuit board, and then is approached by said targeted holes due to parallel moving, to the surface thereof, of said printed circuit board relative to said chucking mechanism, and pushes away with the outside of said fixed pawl the head portion of said already planted component or components from the neighboring space of said targeted holes.

* * * * *